(12) United States Patent
Rabinski et al.

(10) Patent No.: US 6,497,798 B1
(45) Date of Patent: Dec. 24, 2002

(54) CONTROLLABLY MONITORING AND REDUCING A MATERIAL

(75) Inventors: Guenadi Rabinski, Nepean (CA); Eric Saulnier, Ottawa (CA)

(73) Assignee: JDS Uniphase Inc., Ottawa (CA)

( * ) Notice: Subject to any disclaimer, the term of this patent is extended or adjusted under 35 U.S.C. 154(b) by 78 days.

(21) Appl. No.: 09/727,470

(22) Filed: Dec. 4, 2000

(30) Foreign Application Priority Data

Oct. 11, 2000 (CA) .............................................. 2323175

(51) Int. Cl.[7] .......................... C23C 14/34; B44C 1/22; B05D 3/12; B24D 49/00; G01F 15/14
(52) U.S. Cl. ........................ 204/192.13; 216/38; 427/8; 427/355; 451/4; 451/7; 73/432.1
(58) Field of Search ........................ 204/192.1, 192.3; 427/8, 355; 216/38; 451/4, 7; 73/432.1

(56) References Cited

U.S. PATENT DOCUMENTS

| | | | |
|---|---|---|---|
| 5,213,655 A | 5/1993 | Leach et al. ................ 156/627 |
| 5,624,300 A | 4/1997 | Kishii et al. .................. 451/36 |
| 5,877,088 A | * | 3/1999 | Samitsu et al. ............. 438/692 |
| 6,170,149 B1 | * | 1/2001 | Oshiki et al. ............ 29/603.09 |

* cited by examiner

Primary Examiner—Steven H. VerSteeg
(74) Attorney, Agent, or Firm—Neil Teitelbaum

(57) ABSTRACT

The instant invention provides a vibration insensitive method of precisely polishing an object. The method includes the steps of providing an object to be polished, applying a conductive material to a non-electrical current conductive surface of the object, removing a portion of the object and the conductive material through polishing, and measuring an electric current flowing through the conductive material to monitor a progress of the polishing. Advantageously, the method does not require the polishing process to be interrupted to monitor the progress of the polishing. In fact, since the progress is measured as a function of resistance/electrical current, the progress is measured with an accuracy and precision related to each individual turn of a polishing pad. Advantageously, the instant method is remarkably vibration insensitive and is practical for the simultaneous, automatic, and precise, polishing of monolithic objects.

16 Claims, 3 Drawing Sheets

CONTROLLABLY MONITORING AND REDUCING A MATERIAL

FIELD OF THE INVENTION

This invention relates generally to a method of polishing and more specifically to a method for the simultaneous, automatic, and precise, polishing of objects.

BACKGROUND OF THE INVENTION

Precise polishing is usually performed using rotary type polishing machines, where the polishing surface and the surface to be polished are placed in mechanical contact and rapidly moved relative to each other. Typically, the process is a time-consuming, multi-step task that requires constant monitoring. For example, if polishing to a predefined mark is required indicating the desired polishing "stop" or "end" point with an accuracy of a few microns or better relative to the mark line, then a mechanical micrometer indicator cannot be used for measuring the polishing progress due to vibration. Accordingly, precisely monitoring the approach to the mark-line often involves stopping the polishing, de-assembling the object being polished, using a microscope to view the polishing progress, re-assembling the object, and continuing with the polishing procedure. This expensive and time-consuming procedure is continued until the mark-line is reached.

Unfortunately, this method suffers from imprecision related to vibrations produced in the polishing procedure, variability in mounting the object, and in general, the skill of the polisher. Obviously, this method is not easily automated.

It is an object of this invention to provide a precise, vibration insensitive method of polishing an object that does not involve the de-assembling and re-assembling of the object to measure the progress of the polishing.

It is a further object of this invention to provide a method of polishing an object that is easily automated and that is more precise than prior art methods.

SUMMARY OF THE INVENTION

The instant invention provides a method for precisely polishing a non-electrical current conductive object (alternatively, if the object conducts electric current, the object should be coated with a thin layer of non-electric current conductive material using methods known to those skilled in the art). The method includes applying a conductive layer to the object in a manner such that when the object is polished an electric current flowing through the conductive layer changes in dependence upon a progress of the polishing. In a preferred embodiment, the conductive layer is applied in a predetermined pattern such that a measured resistance across the conductive layer is indicative of a predetermined stop-line for polishing.

In accordance with the invention there is provided a method of polishing comprising the steps of: providing an object having a first surface to be polished; applying a conductive material in a predetermined pattern to a second surface of the object; applying an electric current across the conductive material; polishing the first surface such that a portion of the conductive material on the second surface is removed; and measuring one of resistance and electric current across the conductive material for monitoring a progress of the polishing, the one of resistance and electric current being dependent on the predetermined pattern and the portion of the conductive material removed.

In accordance with the invention there is provided a method of polishing as defined in claim 5, further comprising the step of: providing at least one other object having a first surface to be polished; applying a conductive material in a predetermined pattern to a second surface of the at least one other object; simultaneously polishing the first surface of each of the object and the at least one other object; and measuring one of resistance and electric current across the conductive material applied to each of the objects.

In accordance with the invention there is further provided an apparatus for polishing a monolithic object having a conductive pattern coated thereon, the apparatus comprising: a mount for supporting the monolithic object during polishing; a polisher for polishing at least a portion of the monolithic object and the conductive pattern away; a meter having at least two contacts for coupling to the conductive pattern for measuring one of an electric current and a resistance across the conductive pattern; and a processor coupled to the polisher and the meter for receiving data from the meter and providing a signal to the polisher indicative of a progress of the polishing.

In accordance with the invention there is further provided a monolithic object comprising an electrically conductive region coated thereon for indicating when the object is polished to a desired length, at least a portion of said electrically conductive region designed to be polished away, said electrically conductive region having at least two terminals electrically coupled thereto for monitoring one of conductivity and resistance.

Advantageously, the method does not require the use of a microscope to measure the mark line. The approach to the mark line is measured as a function of resistance/electrical current—thus providing a more accurate and more precise measurement. Since the electrical current conductive bridge becomes thinner and thinner as the mark line is approached, the accuracy is high enough to measure changes in the progress of polishing for each individual turn of a fine polishing pad. Furthermore, the instant method is advantageously vibration insensitive.

BRIEF DESCRIPTION OF THE DRAWINGS

Exemplary embodiments of the invention will now be described in conjunction with the drawings in which.

DETAILED DESCRIPTION OF THE INVENTION

The instant invention provides a method of precisely polishing an object. The method includes the steps of providing an object to be polished, applying a conductive material to a surface of the object, removing a portion of the object and the conductive material through polishing, and measuring a resistance or an electric current flowing through the conductive material to monitor a progress of the polishing. For exemplary purposes, the following description refers only to measuring a resistance across the conductive material.

Figure 1A:
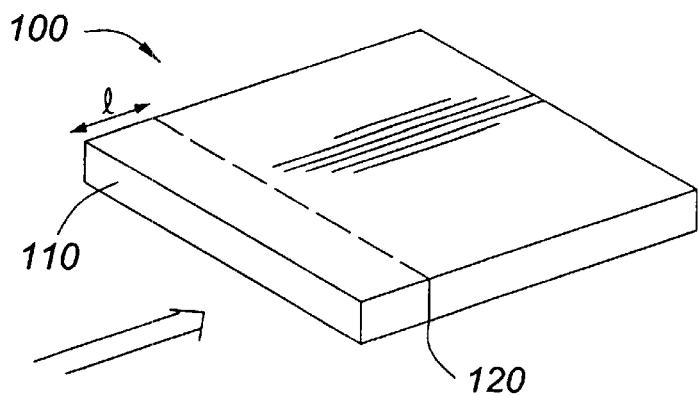
FIG. 1a is a schematic diagram of an object to be polished in the form of a slab having an end to be polished.

Referring to FIG. 1a, there is shown an object 100 in the form of a slab having a surface 110 to be polished. Dashed line 120 depicts the predetermined stop-line, which shows the length, l, of the object that must be removed by polishing. The thick arrow indicates the polishing direction.

Figure 1B:
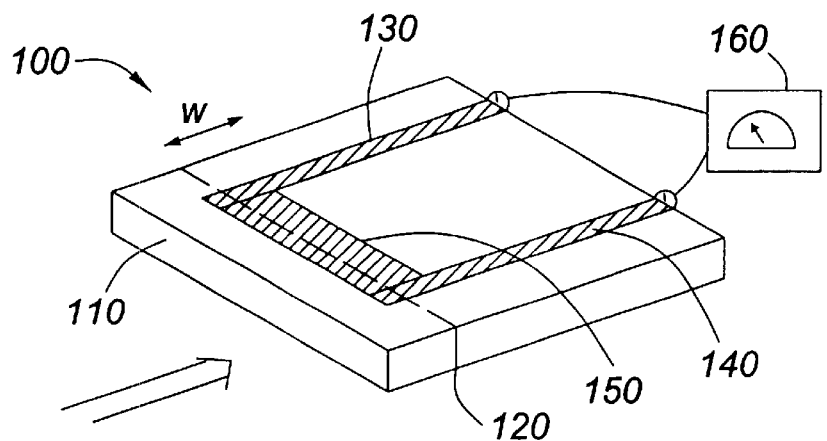
FIG. 1b is a schematic diagram of the object shown in FIG. 1a having a conductive material applied to a face thereof in the form of two strips connected by a bridge.

Referring to FIG. 1b, there is shown a conductive material applied to the object 100 in a predetermined pattern in accordance with the instant invention. For exemplary purposes, the predetermined pattern is shown as including first 130 and second 140 strips of conductive material connected by a bridge 150 of the same conductive material. In this embodiment, the bridge 150 is shown having a width, w, centered about the stop-line.

When a closed electrical circuit including the bridge and the two strips of conductive material is provided, e.g., by soldering caps and wires to the conductive material, an electric current is able to pass through the conductive material. The resistance, which is for example measured by multimeter 160, is dependent on the width of the bridge, w.

Preferably, the resistance across the conductive material is measured simultaneously to the object being mechanically polished. In this manner, the method provides a very sensitive measure of the progress of the polishing process, for every rotational turn of the polishing pad. Optionally, the process is calibrated such that there is a known relationship between the measured resistance and the progress of the polishing.

Figure 1C:
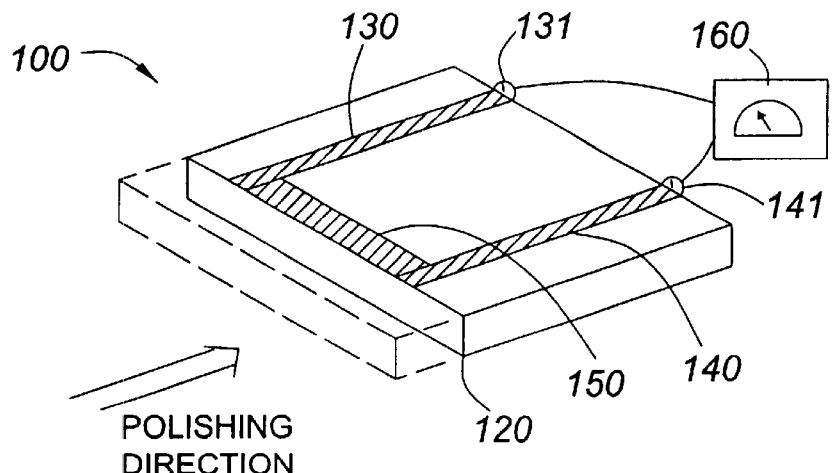
FIG. 1c is a schematic diagram of the object shown in FIG. 1b showing a portion of the conductive material removed as a result of the end being polished to a predetermined stop-line.

FIG. 1c illustrates the object 100 having been polished to the predetermined stop-line 120. In accordance with the instant invention, at least a portion of the predetermined pattern has been removed. According to FIG. 1c, a portion of the width, w, of the bridge 150 has been removed, thus increasing the measured resistance thereacross.

Figure 2:
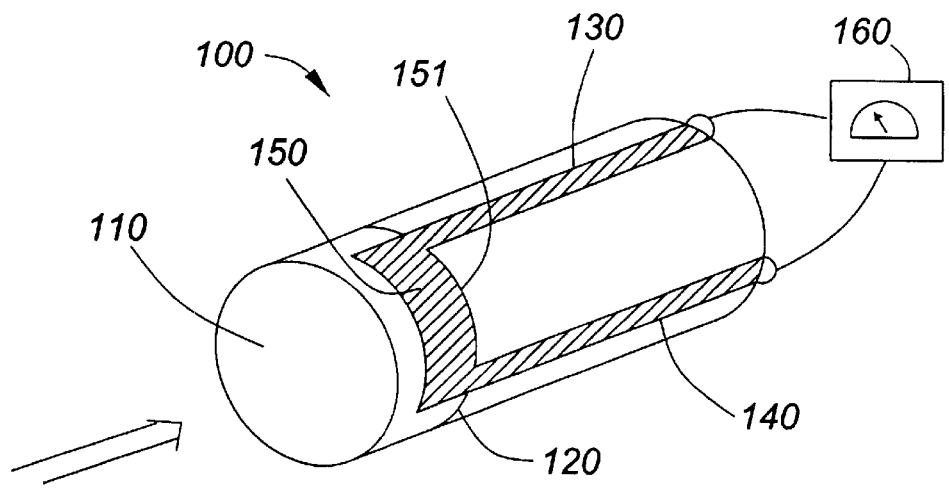
FIG. 2 is a schematic diagram of an object to be polished in the form of a cylinder having a conductive material applied thereto in the form of two strips connected by a bridge, the bridge having an edge disposed about a predetermined stop-line for polishing.

Referring to FIG. 2, there is shown a preferred embodiment of the invention, wherein the predetermined pattern is selected such that an inner edge 151 of the bridge is coincident with the predetermined stop-line 120. Accordingly, to reach the stop-line 120, the object is polished until the bridge is removed and a cease to the electric current flow is detected i.e., the measured resistance approaches infinity.

Figure 3:
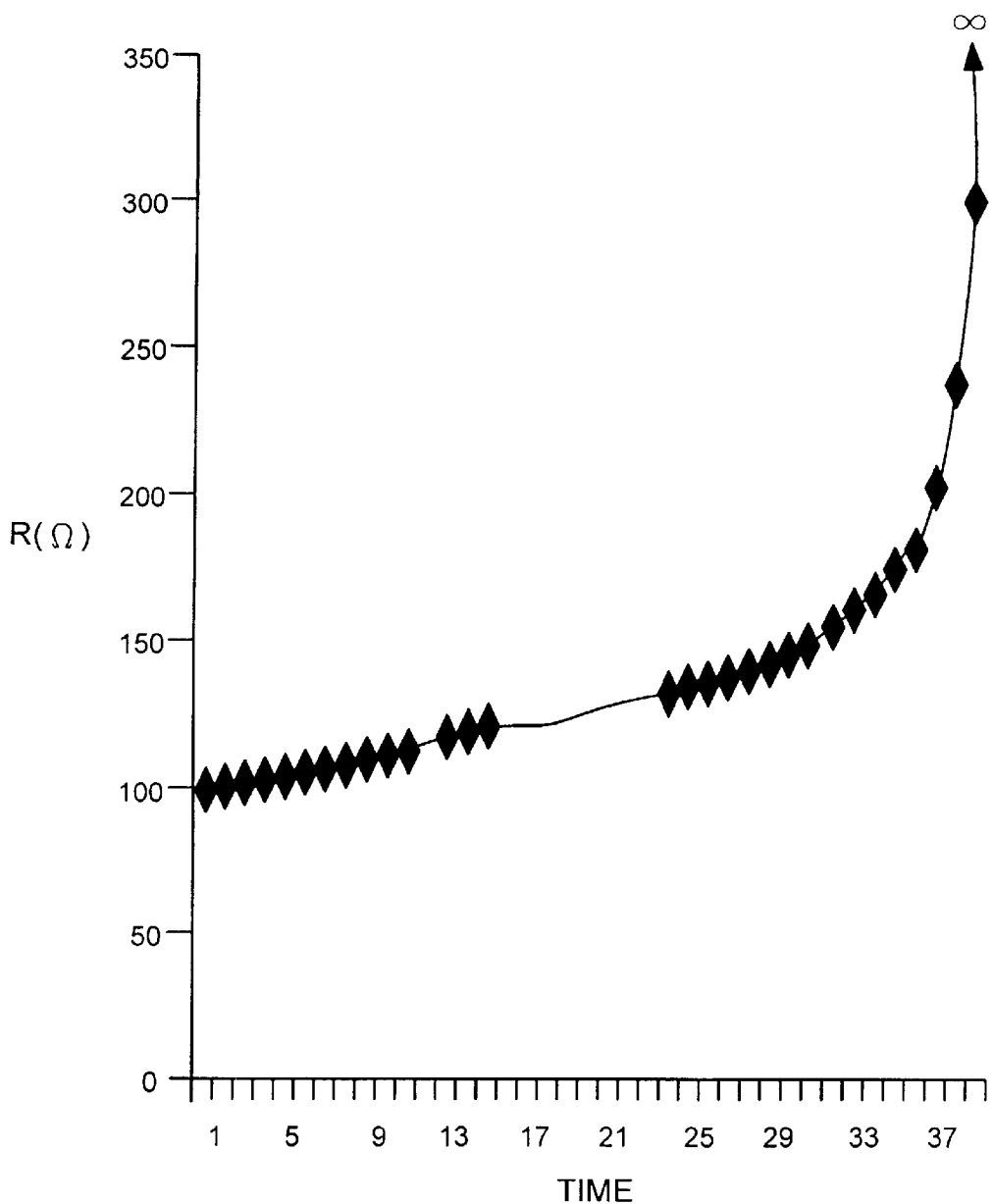
FIG. 3 is a plot of resistance versus polishing time showing the sensitivity of the measurement in close proximity to the predetermined stop-line.

A plot of resistance versus polishing time is shown in FIG. 3 for the embodiment shown in FIG. 2. The plot illustrates how the sensitivity of the measurement increases as the polishing time increases and the polishing shifts closer to the predetermined stop-line. Accordingly, the instant method provides a remarkably accurate and precise measurement of the predetermined stop-line. A controller, including a meter and a processor, advantageously monitors the measurement to provide automated polishing to precise tolerances.

Figure 4:
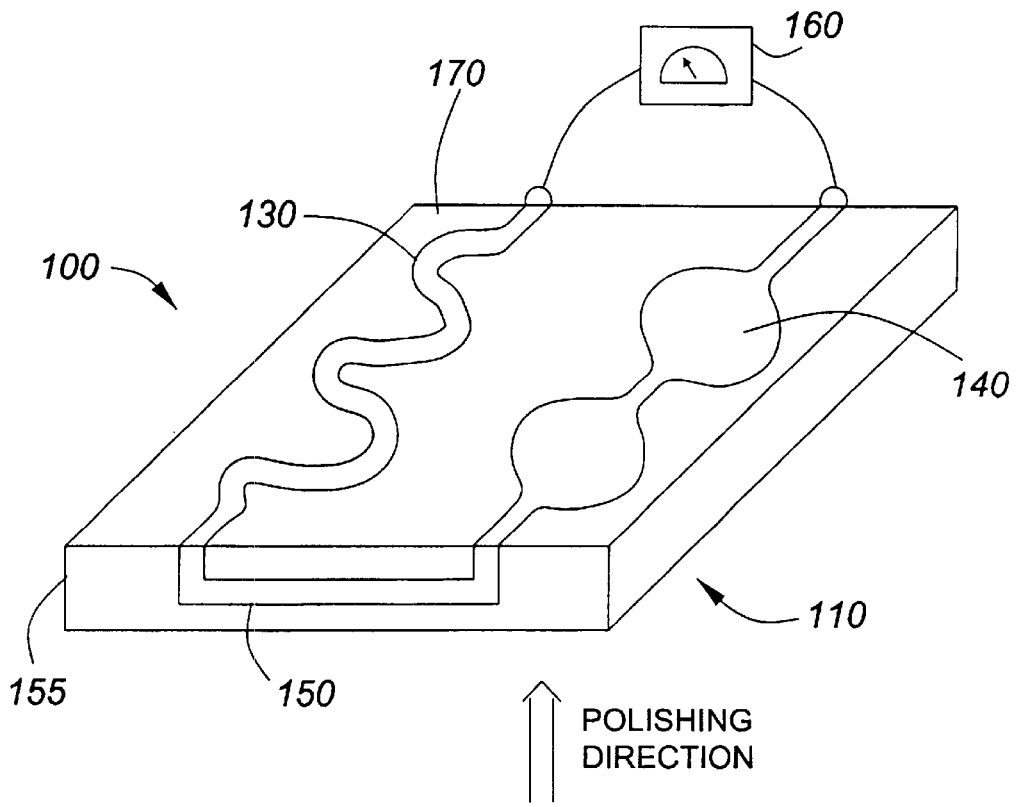
FIG. 4 is a schematic diagram of an object to be polished in the form of a slab having a face to be polished.

Referring to FIG. 4, there is shown another embodiment wherein the surface to be polished 110 corresponds to a face of the slab 100 and the predetermined pattern of electric current conductive material layer includes a bridge 150 on end 155. The strips 130 and 140 are shown applied to end face 170 having various free shapes. Polishing of the surface 110 removes a portion of the conductive material on the bridge 150, thus increasing the measured resistance in accordance with the instant invention.

Preferably, the conductive material is applied as a thin layer to the object using a precise and accurate method, such as sputtering. Optionally, a mask indicating the mark point for polishing is used. Typically, the conductive material is applied to a non-electrical current conductive surface of the object. Alternatively, if the object conducts electrical current, the object is coated with a thin layer of non-electric current conductive material, prior to performing the method described herein. The electric current conductive material is selected from any of the conductive metals or compounds, e.g., gold, silver, copper, indium tin oxide, etc., and is optionally removed after the polishing procedure.

The use of indium tin oxide is particularly attractive for polishing optical components, including those used in telecommunication systems, since it is optically transparent, and does not need to be removed after polishing.

A further advantage of using indium tin oxide relates to the fact that it has a relatively high resistivity, and thus is useful as a heating element for the polished optical components. For example, once polishing has been terminated and the object has been removed from the polishing apparatus, the indium tin oxide layer remains on the optical component. Since this layer is optically transparent, it does not generally interfere with the function of the optical component. To initiate heating of the optical component, a closed circuit is provided including at least a portion of the indium tin oxide layer. As electric current flows through this layer, the high resistance causes an increase in temperature in the layer, which is transferred to the optical component. Preferably, the same contacts used for measuring the resistance while polishing the object are also used for providing a closed circuit for heating the object after it has been polished. For example, in the embodiment shown in FIG. 1c, the contacts 131, 141 are connected to a source for providing electric current flowing through the strip 130, remaining bridge 150, and strip 141. In the embodiment shown in FIG. 2, each strip 130 and 140 is provided with two additional contacts for providing an electric current independently flowing through each strip after the object is polished. Optionally, the conductive material is applied to each object to be polished in dependence upon the desired spot heating after polishing (i.e, with various free shapes). In particular, the conductive layer is applied in a predetermined pattern having a shape that defines the thermo-conductive gradient. The instant invention eliminates the need to bond heaters to the polished objects for spot heating, thus reducing the cost and the number of steps that is performed.

Advantageously, the instant invention is easily automated for simultaneously polishing a plurality of objects. For example, in one embodiment a plurality of objects to be polished is subject to a sputtering deposition process for applying a conductive material in a predetermined pattern thereto. Each object is subsequently mounted to a polishing apparatus having a plurality of mounts for supporting the plurality of objects. Each object is connected to a meter, such as an ohm meter, for measuring the resistance corresponding to the electric current flowing through the conductive layer as a function of a degree of polishing. When the ohm-meter indicates that a certain object has been polished to the predetermined stop-line, the polishing is terminated. Optionally, the object is further subjected to a final polishing step using an ultra-fine polishing pad for a specified time interval before being removed.

Accordingly, the instant method is practical for the simultaneous, automatic, and precise, polishing of objects. Furthermore, the instant invention provides a vibration insensitive precise method of polishing objects. Moreover, the instant method is convenient for the precise polishing of monolithic objects and/or insulating materials.

Of course, numerous other embodiments can be envisaged without departing from the spirit and scope of the invention. In particular, the instant invention is not limited to the exemplary embodiments disclosed herein.

What is claimed is:

1. A method of polishing comprising the steps of:

providing an object having a first surface to be polished;

applying a conductive material in a predetermined pattern to a second surface of the object;

applying an electric current across the conductive material;

polishing the first surface such that a portion of the conductive material on the second surface is removed; and measuring one of resistance and electric current across the conductive material for monitoring a progress of the polishing, the one of resistance and electric current being dependent on the predetermined pattern and the portion of the conductive material removed.

2. A method of polishing as defined in claim 1, wherein the first and second surfaces are non-parallel.

3. A method of polishing as defined in claim 2, wherein the predetermined pattern is selected such that a predetermined value related to the one of resistance and electric current is indicative that the object has been polished to a predetermined stop-line.

4. A method of polishing as defined in claim 3, wherein the predetermined pattern includes two strips connected by a bridge.

5. A method of polishing as defined in claim 4, wherein the predetermined pattern is selected such that the step of polishing the first surface progressively reduces a width of the bridge for affecting the one of resistance and electric current.

6. A method of polishing as defined in claim 5, wherein the predetermined pattern is selected such that an inner edge of the bridge is coincident with the predetermined stop-line.

7. A method of polishing as defined in claim 5, wherein the step of applying a conductive material comprises a sputtering deposition process.

8. A method of polishing as defined in claim 5, comprising the step of stopping polishing when the predetermined value of the one of resistance and electric current is reached.

9. A method of polishing as defined in claim 8, wherein the predetermined pattern is selected for spot heating the object after it has been polished.

10. A method of polishing as defined in claim 9, wherein the predetermined pattern is selected for providing a predetermined thermo-conductive gradient.

11. A method of polishing as defined in claim 5, wherein the conductive material is a metal.

12. A method of polishing as defined in claim 5, wherein the conductive material is optically transparent.

13. A method of polishing as defined in claim 12, wherein the conductive material is indium tin oxide.

14. A method of polishing as defined in claim 5, further comprising the step of:

providing at least one other object having a first surface to be polished;

applying a conductive material in a predetermined pattern to a second surface of the at least one other object;

simultaneously polishing the first surface of each of the object and the at least one other object; and measuring one of resistance and electric current across the conductive material applied to each of the objects.

15. A method of polishing as defined in claim 14, wherein the steps of simultaneously polishing the first surface of each of the object and the at least one other object and measuring one of resistance and electric current across the conductive material applied to each of the objects is automated.

16. A method of polishing as defined in claim 5, wherein the steps of polishing the first surface and measuring the one of resistance and electric current are automated.

* * * * *